US 10,886,049 B2
(12) United States Patent
Strong

(10) Patent No.: US 10,886,049 B2
(45) Date of Patent: Jan. 5, 2021

(54) COILED COUPLED-LINE HYBRID COUPLER

(71) Applicant: Joshua A. Strong, Ellicott City, MD (US)

(72) Inventor: Joshua A. Strong, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 29 days.

(21) Appl. No.: 16/206,014

(22) Filed: Nov. 30, 2018

(65) Prior Publication Data

US 2020/0176158 A1 Jun. 4, 2020

(51) Int. Cl.
| | |
|---|---|
| H01F 6/06 | (2006.01) |
| H01P 3/08 | (2006.01) |
| H03K 19/195 | (2006.01) |
| H01P 11/00 | (2006.01) |
| H01F 41/04 | (2006.01) |
| G06F 1/10 | (2006.01) |
| H01L 27/18 | (2006.01) |
| H01L 23/66 | (2006.01) |

(52) U.S. Cl.
CPC ............. *H01F 6/06* (2013.01); *G06F 1/10* (2013.01); *H01F 41/048* (2013.01); *H01L 23/66* (2013.01); *H01L 27/18* (2013.01); *H01P 3/08* (2013.01); *H01P 11/003* (2013.01); *H03K 19/195* (2013.01); *H01L 2223/6627* (2013.01)

(58) Field of Classification Search
CPC combination set(s) only.
See application file for complete search history.

(56) References Cited

U.S. PATENT DOCUMENTS

| | | | |
|---|---|---|---|
| 4,800,345 A | 1/1989 | Podell et al. | |
| 5,552,735 A | 9/1996 | Kang et al. | |
| 5,818,308 A | 10/1998 | Tanaka et al. | |
| 6,346,863 B2 | 2/2002 | Sasaki et al. | |

(Continued)

FOREIGN PATENT DOCUMENTS

| | | |
|---|---|---|
| EP | 2730029 A2 | 5/2014 |
| EP | 3254375 A1 | 12/2017 |

(Continued)

OTHER PUBLICATIONS

Rafique et al.: Tunable filter based on DC-SQUID chain 1; May 1, 2007 (May 1, 2007), pp. 1-2, XP055585121, DOI: 10.13140/RG.2.1.1612.5688, (Year: 2007).*

(Continued)

*Primary Examiner* — Mounir S Amer
(74) *Attorney, Agent, or Firm* — Tarolli, Sundheim, Covell & Tummino LLP

(57) ABSTRACT

A superconducting on-chip coiled coupled-line 90° hybrid coupler is made of a series array of repeated cells of coiled transmission lines that are inductively and capacitively coupled. The coupler splits an incoming microwave signal into two output signals of roughly equal power and separated in phase from each other by roughly 90°. The coupler can be incorporated into such superconducting electronic circuits as clock-distribution networks for reciprocal quantum logic (RQL) systems, as well as Josephson-based phase shifters and vector modulators.

20 Claims, 8 Drawing Sheets

(56) References Cited

U.S. PATENT DOCUMENTS

| | | | |
|---|---|---|---|
| 6,407,647 | B1 | 6/2002 | Apel et al. |
| 6,636,126 | B1 | 10/2003 | Pozdeev |
| 6,747,525 | B2 | 6/2004 | Iida et al. |
| 6,765,455 | B1 | 7/2004 | De Lillo et al. |
| 6,806,558 | B2 | 10/2004 | Apel |
| 7,969,178 | B2 | 6/2011 | Przybysz et al. |
| 9,257,736 | B1 | 2/2016 | Josypenko |
| 9,548,158 | B2 * | 1/2017 | Groves ............... H01F 17/0006 |
| 9,647,662 | B1 | 5/2017 | Abutaleb et al. |
| 9,710,758 | B2 | 7/2017 | Bunyk et al. |
| 9,722,589 | B1 | 8/2017 | Talanov et al. |
| 9,768,771 | B2 | 9/2017 | Naaman |
| 9,928,948 | B2 | 3/2018 | Naaman et al. |
| 10,042,805 | B2 | 8/2018 | Naaman et al. |
| 10,133,299 | B1 | 11/2018 | Strong et al. |
| 2003/0218516 | A1 | 11/2003 | Gilbert et al. |
| 2004/0189388 | A1 | 9/2004 | Nguyen et al. |
| 2006/0147154 | A1 | 7/2006 | Thom et al. |
| 2006/0220737 | A1 | 10/2006 | Sanderson |
| 2008/0048762 | A1 | 2/2008 | Inamdar et al. |
| 2009/0078931 | A1 | 3/2009 | Berkley |
| 2009/0189712 | A1 | 7/2009 | Jiang |
| 2010/0148853 | A1 | 6/2010 | Harris et al. |
| 2011/0054876 | A1 | 3/2011 | Biamonte et al. |
| 2015/0254571 | A1 | 9/2015 | Miller et al. |
| 2016/0335558 | A1 | 11/2016 | Bunyk et al. |
| 2016/0335560 | A1 | 11/2016 | Mohseni et al. |
| 2017/0127205 | A1 | 5/2017 | Lin |
| 2017/0201224 | A1 | 7/2017 | Strong et al. |
| 2017/0286859 | A1 | 10/2017 | Harris et al. |
| 2018/0091115 | A1 | 3/2018 | Abdo |
| 2019/0007051 | A1 | 1/2019 | Sete et al. |

FOREIGN PATENT DOCUMENTS

| | | |
|---|---|---|
| JP | 2013-058705 A | 3/2013 |
| JP | 5363993 B2 | 12/2013 |
| WO | 98/36467 | 8/1998 |
| WO | 9836467 | 8/1998 |
| WO | 20100028183 A1 | 3/2010 |
| WO | 2014028302 A2 | 2/2014 |
| WO | 20160126981 A1 | 8/2016 |
| WO | 2017062143 A1 | 4/2017 |
| WO | 20170058194 A1 | 4/2017 |
| WO | 2017/111949 | 6/2017 |
| WO | 2017127205 A1 | 7/2017 |
| WO | 2017022806 A1 | 11/2017 |
| WO | 2017/222806 | 12/2017 |

OTHER PUBLICATIONS

Tuorila et al: "Efficient protocol for qubit initialization with a tunable environment", arxiv.org, Cornell University Library, 201, Olin Library Cornell University Ithaca, NY 14853, Dec. 13, 2016 (Dec. 13, 2016), XP080743892, DOI: 10.1038/S41534-017-0027-1; abstract, figures 1-3, p. 1, line 1—p. 7, last line.
Final Office Action for U.S. Appl No. 15/868,557 dated Jul. 25, 2019.
Japanese Office Action for Application No. 2018-533894 dated Aug. 20, 2019.
Non Final Office Action for U.S. Appl. No. 15/866,602 dated Aug. 21, 2019.
Non Final Office Action for U.S. Appl. No. 16/255,588 dated Sep. 5, 2019.
Australian Search Report corresponding to Australian Patent Application No. 2016388350, dated Jan. 7, 2019.
Chen,Y. et al. "Qubit architecture with high coherence and fast tunable coupling." Physical review letters 113.22(2014): 2205022.
Written Opinion and Search Report corresponding to International Application No. PCT/US2019/014796 dated Apr. 26, 2019.
Anonymous: What is the self-resonant frequency of a capacitor?, May 22, 2017, XP055582197, Retrieved from the Internet:URL:https://www.quora.com What-is-the-self-resonant-frequency-of-a-capacitor[retrieved on Apr. 17, 2019] the whole document.
Tuori et al: 11 Efficient protocol 1-20 for qubit initialization with a tunable environment, arxiv .org, Cornell University Li bra ry, 201 Olin Library Cornell University Ithaca, NY 14853, Dec. 13, 2016 (Dec. 13, 2016)'XP080743892,DOI: 10.1038/S41534-017-0027-1 abstract; figures 1-6 p. 1, line 1—p. 6, last line p. 8, line 1—p. 11, last line p. 13, line 10—p. 16, last line.
Robertson et al: "Superconducting device to isolate,entangle, and read out quantum flux states", Mar. 21, 2016, pp. 1-4,ResearchGate Retrieved from the Internet: IRL:https://www.researchgate.net/publication/255276503, Superconducting device to isolate entangle and read out quantum flux states[retrieved on Sep. 27, 2018]abstract; figures 1-4 p. 1, left-hand column, line 1—p. 4,right-hand column, last line.
Kafri:"Tunable inductive coupling of superconducting qubits in the Srongly nonlinear regime",arXiv:1606.08382v2,Jan. 23, 2017 (Jan. 23, 2017), xP055469297,Retrieved from the internet:URL:https://arxiv.orgabs1606.08382v2[retrieved on Apr. 20, 2018]abstract; figures 1-3 p. 1, line 1—p. 22, last line.
Schmitt et al: "Multiplexed readout of transmon qubits with Josephson Bifurcation amplifiers",Physical Review A (Atomic, Molecular, and Optical Physics),vol. 90, No. 6, Dec. 1, 2014 (Dec. 1, 2014), XP055511194, USA ISSN: 1050-2947, DOI: 10.1103/PhysRevA. 90.062333 abstract; figures 1-4 p. 1, Left-hand column, line 1—p. 4,right-hand column, line 25.
Canadian Office Action Corresponding to Canadian Application No. 2,987,426 dated Apr. 8, 2019.
Lanting et al: "Cotunneling in pairs of coupled flux qubits", Physical Review B, vol. 82, 060512R, Aug. 23, 2010, XP055469296, figures 1(a) & (b).
International Search Report for International Application No. PCT/US2018/015729 dated May 2, 2018.
Ferguson et al: "Non-stoquastic XX couplers for superconducting flux qubits", Abstract submitted to the APS March Meeting 2017, Jan. 4, 2017, XP055469302, Retrieved from the Internet: URL: http://absimage.aps.org/image/Mar17/MWS_Mar17-2016-008291.pdf, abstract.
G. Samach, et al.: "Coupled qubits for next generation quantum annealing: novel interactions", Abstract submitted to the APS March Meeting 2017, Jan. 4, 2017, XP055469301, Retrieved from the Internet: URL: http://absimage.aps.org/image/MAR17-2016-003302.pdf, abstract.
International Search Report for International Application No. PCT/US2019/035607 dated Oct. 1, 2019.
International Search Report for International Application No. PCT/US2019/036576 dated Oct. 24, 2019.
Fabio Chiarello, et al: Superconducting tunable flux qubit with direct readout scheme: Superconducting tunable flux qubit with direct readout scheme:. Superconductor Science and Technology, IOP Publishing,K Techno House, Bristol, GB, vol. 18, No. 10, Oct. 1, 2005, pp. 1370-1373, XP020067996, ISSN: 0953-2048, DOI: 10.1088/0953-2048/18/10/021 Sections 1-3; figures 1, 2.
Harris R et al: "Sign- and magnitude-tunable coupler for superconducting flux qubits", arxiv.org, Cornell University Library, 201 Olin Library Cornell University Ithaca, NY 14853, Aug. 11, 2006 (Aug. 11, 2006), XP080248067, DOI: 10.1103/PHYSREVLETT.98. 177001 figure 1.
Kang H et al: "Current recycling and SEQ signal transfer in large scale RSFQ circuits", IEEE Transactions on Applied Superconductivity, IEEE Service Enter, Los Alamitos, CA, US, vol. 13, No. 2, Jun. 1, 2003 (Jun. 1, 2003), pp. 547-550, XP011097824, ISSN: 1051-8223, DOI: 10. 1109/TASC.2003.813932 figure 2.
Ehara K et al: "Development of Pulse Transfer Circuits for Serially Biased SFQ Circuits Using the Nb 9-Layer 1-$-544 mu\hbox{m}$ Process", IEEE Transactions on Applied Superconductivity, IEEE Service Center, Los Alamitos, CA, US, vol. 23, No. 3, Jun. 1, 2013 (Jun. 1, 2013), p. 1300504, XP011513813, ISSN: 1051-8223, DOI: 10. 1109/TASC.2012.2233535 figure 1.
Yu Chen et al: "Qubit Architecture with High Coherence and Fast Tunable Coupling", Physical Review Letters, vol. 113, No. 22, Nov. 26, 2014 (Nov. 26, 2014), XP055403674, US ISSN: 0031-9007, DOI: 10.1103/PhysRevLett.113.220502 figure 1.

(56) References Cited

OTHER PUBLICATIONS

International Search Report for International Application No. PCT/US2017/036169 dated Sep. 25, 2017.
International Search Report for International Application No. PCT/US2019/012049 dated Dec. 4, 2019.
Worsham A H et al: "A Single Flux Quantum cross-bar switch and demultiplexer" IEEE Transactions on Applied Superconductivity, IEEE Service Center, Los Alamitos, CA, US, vol. 5, No. 2, Jun. 1, 1995 (Jun. 1, 1995), pp. 2996-2999, XP011504599, ISSN: 1051-8223, DOI: 10.1109/77.403222 Section II.; figure 1.
International Search Report corresponding to International application No. PCT/US2019/012068 dated Mar. 25, 2019.
Chen et al.: "Qubit Architecture with High Coherence and Fast Tunable Coupling", Physical Review Letters, US, (Nov. 26, 2014), vol. 113, No. 22, doi:10.1103/PhysRevLett.113.220502, ISSN 0031-9007.
Ehara, et al.: "Development of Pulse Transfer Circuits for Serially Biased SFQ Circuits Using the Nb 9-Layer 1um Process", IEEE Transactions on Applied Superconductivity, IEEE Service Center (Jun. 1, 2013), vol. 23, No. 3, p. 1300504.
International Search Report from corresponding PCT/US2019/012065, dated May 17, 2019.
International Search Report from corresponding PCT/US2019/018497; dated May 26, 2019.
Lu: "Master Thesis Towards Tunable Coupling Between Two Superconducting Transmission Line Resonators"; Aug. 24, 2012 (Aug. 24, 2012), XP055585125, Retrieved from the Internet:URL:https://www.wmi.badw.de/publications/theses/Xiaoling, Lu Master Thesis 2012.pdf [retrieved on May 2, 2019]; abstract, section 1, section 2, section 3, section 4.
Jeffrey Scott Birenbaum, "The C-shunt Flux Qubit: A New Generation of Superconducting Flux Qubit", eScholarship, (Jan. 1, 2014), URL: https://escholarship.org/uc/item/3gg7j6rh, (Sep. 27, 2018).
Australian Examination Report for Application No. 2018299815 dated Aug. 6, 2020.
International Search Report for Application No. PCT/US2019/058793 dated Aug. 4, 2020.

* cited by examiner

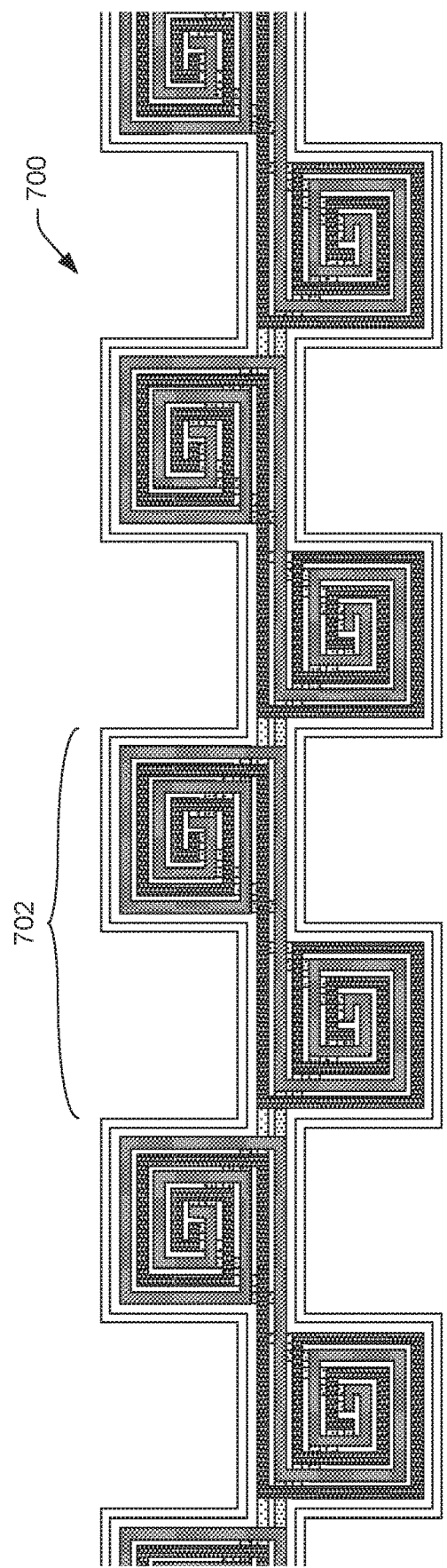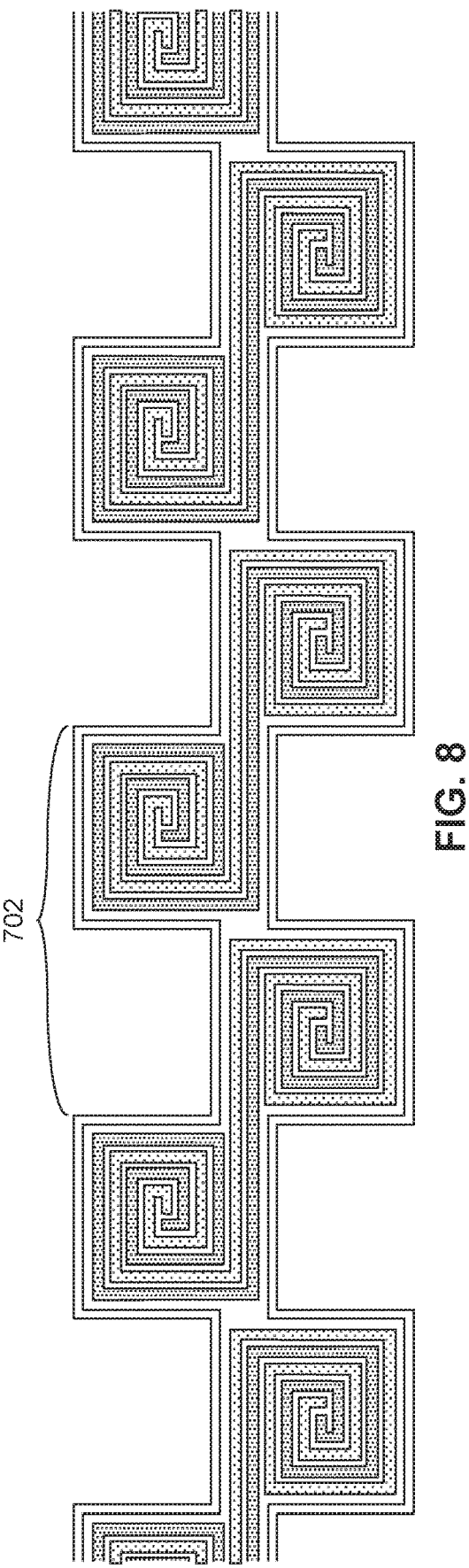

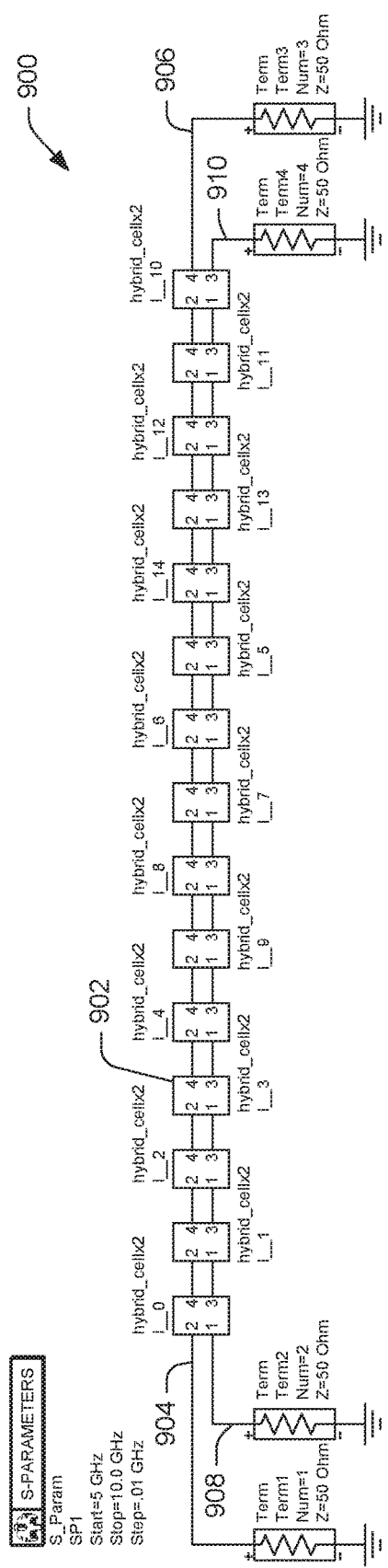
FIG. 9
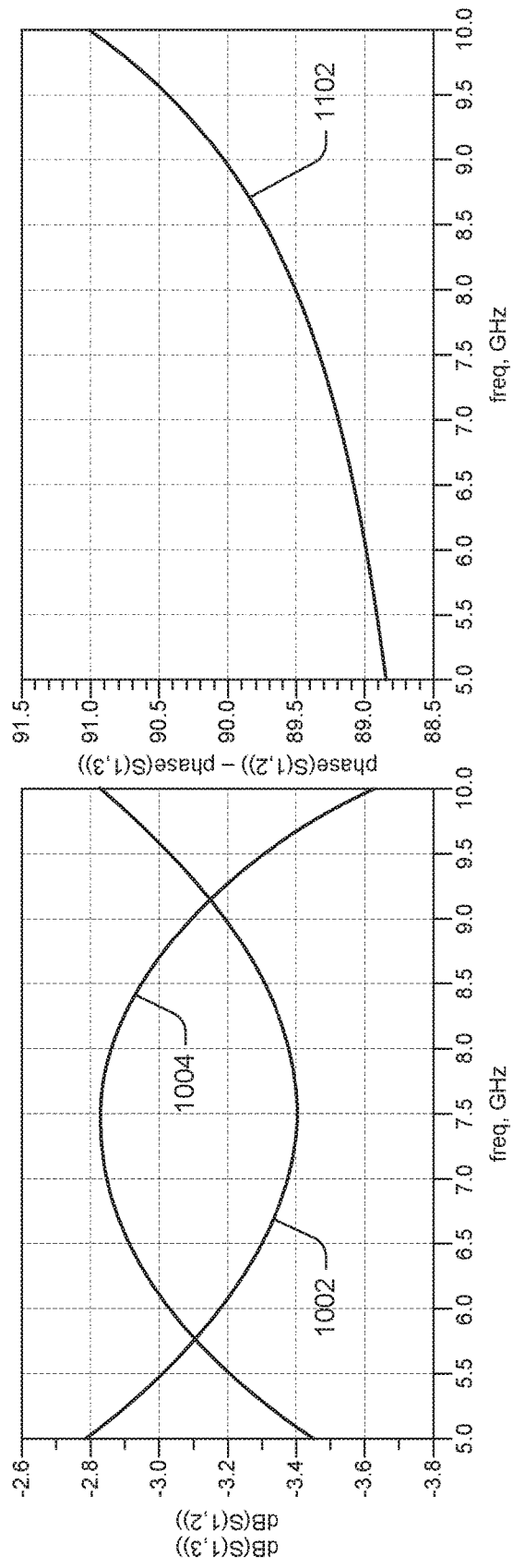
FIG. 11
FIG. 10

COILED COUPLED-LINE HYBRID COUPLER

TECHNICAL FIELD

The present invention relates generally to superconducting circuits, and specifically to a coiled coupled-line hybrid coupler.

BACKGROUND

The state of the art in quantum computing relies on superconducting circuits that operate well below room temperature, e.g., below about 4 kelvins, and in some examples below about 0.1 kelvins. Limited connectivity and locality between qubits (which function as the logic objects of quantum computers) and other quantum objects can limit the number and type of problems that quantum computers can solve. Passive transmission lines and couplers are among the devices that can be used to increase the connectivity between quantum objects and the permissible distances between such objects on a quantum computing chip.

SUMMARY

One example includes a superconducting coiled coupled-line hybrid coupler on a chip. The coupler includes a first port configured to receive an input signal from a microwave object and two other ports amongst which the power of the input signal is split with about 90° phase separation. A primary transmission line in the coupler galvanically connects the first port and one of the two other ports. The primary line is coiled in at least two coils in series with each other. A coiled secondary transmission line in the coupler galvanically connects with the other of the two other ports and not with the primary line. The secondary line is coiled in the at least two coils and about uniformly spaced from the primary line in at least one planar dimension over a coupling length that includes the at least two coils. The coupler further includes a ground plane. Over at least a portion of the coupling length in each of the at least two coils, one of the primary and secondary transmission lines is surrounded by and within a coupling distance from the other of the transmission lines on at least three sides, as viewed from a transverse-plane cross-section of the one transmission line.

Another example includes a method in which spacings between capacitively and inductively coupled transmission line traces are selected to tune impedances of a common-mode impedance (also termed an even mode impedance) and a differential-mode impedance (also termed an odd mode impedance) of a coiled coupled-line hybrid coupler, and a number of serially arranged cells in the coiled coupled-line hybrid coupler, each cell containing one or more transmission line coils, are selected to set the maximum-coupling frequency of the coiled coupled-line hybrid coupler. The coiled coupled-line hybrid coupler is then fabricated on a chip based on the selected transmission-line spacings and the selected number of serially arranged cells. The tuned common-mode impedance and differential-mode impedance can thus be set, respectively, to a predetermined common-mode impedance and a predetermined odd-mode impedance, and the maximum-coupling frequency of the coiled coupled-line hybrid coupler can thus be set to a predetermined frequency. Accordingly, these impedances and this maximum-coupling frequency can be customized at design/fabrication time for a particular coupler application.

Yet another example includes a coiled coupled-line hybrid coupler cell. The cell includes superconducting primary and secondary transmission lines. The primary line includes planar spiral-shaped input and output primary traces on a first plane and, on a second plane above or below the first plane, a planar carry-over primary trace shaped as two connected spirals. The spirals of the carry-over primary trace are wound in opposite directions and displaced from each other in two planar dimensions. Traces of the primary line are galvanically connected in series with the primary carry-over trace connecting the primary input and output traces. The secondary line includes planar spiral-shaped input and output secondary traces on the first plane and, on the second plane, a planar carry-over secondary trace shaped as two connected spirals. The spirals of the carry-over secondary trace are wound in opposite directions and displaced from each other in two planar dimensions. The traces of the secondary line are galvanically connected in series with the secondary carry-over trace connecting the secondary input and output traces. The cell further includes input and output ports for each of the primary and secondary lines configured to connect to corresponding ports of identical hybrid coupler cells when arranged adjacently to the coupler cell in serial fashion. The traces form two coils that provide inductive and capacitive coupling between the primary and secondary transmission lines.

Still another example includes a reciprocal quantum logic (RQL) having a coupler that includes a cell as set forth in the previous paragraph, and an RQL clock network. The coupler is configured to provide signals separated in phase by 90° to the RQL clock network by respectively connecting in-phase ("I") and quadrature-phase ("Q") resonators of the RQL clock network to different transmission lines of the coupler at opposite ends of the coupler.

BRIEF DESCRIPTION OF THE DRAWINGS

FIG. 7 is a plan view of a portion of an example coiled coupled-line hybrid coupler consisting of a serial chain of coupler cells.

FIG. 8 is a plan view of a portion of an example coiled coupled-line hybrid coupler with upper-plane transmission line traces removed so as to show lower-plane transmission line traces.

FIG. 9 is a simulation schematic diagram of a coiled coupled-line hybrid coupler made up of a plurality of cells.

FIG. 10 is graph showing the coupling strength performance of the circuit of FIG. 9 over a frequency range.

FIG. 11 is graph showing the phase separation performance of the circuit of FIG. 9 over the same frequency range.

DETAILED DESCRIPTION

Figure 1:
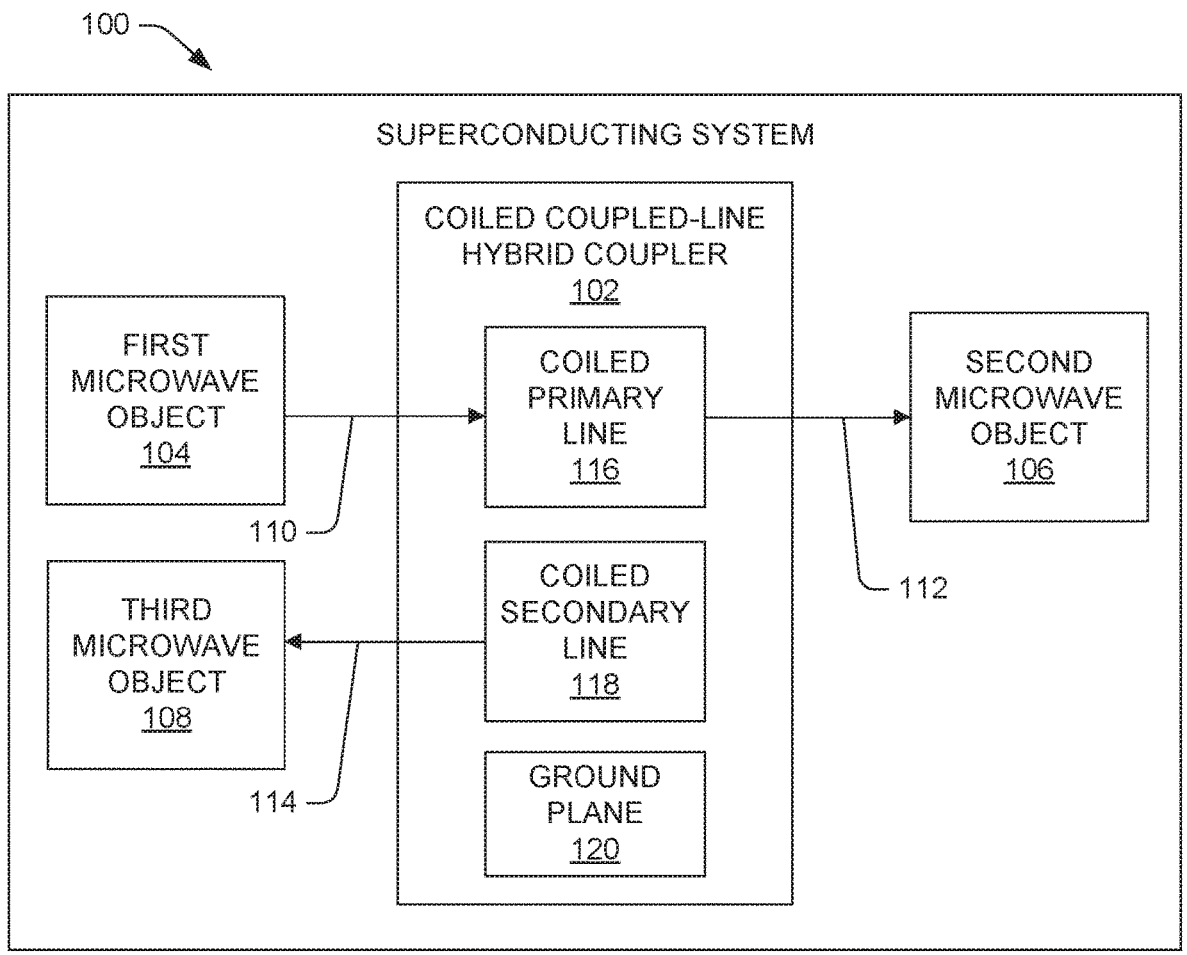
FIG. 1 is a block diagram of an example superconducting system with a coiled coupled-line hybrid coupler.

This disclosure relates generally to an on-chip coiled coupled-line 90° hybrid coupler, to cells of coiled transmission lines that can compose such a coupler, and to superconducting circuits and systems incorporating such a coupler. The disclosed coupler devices can split an incoming microwave signal into two output signals that can be of equal power and can be separated in phase from each other (e.g., by 90°). The on-chip coiled coupled-line hybrid couplers disclosed herein can be incorporated into such superconducting electronic circuits as clock-distribution networks for reciprocal quantum logic (RQL) systems, as well as Josephson-based phase shifters and vector modulators.

A hybrid coupler is a device that couples a defined amount of electromagnetic power in a transmission line to one or more ports, enabling an input signal to be used in another circuit. A hybrid coupler can be used, for example, to split power from an input signal equally between two output ports. The resultant two output signals can be of about equal amplitude and can have a phase difference, e.g., an about 90° phase difference, with respect to each other. In practice, the amplitude and phase difference can have some error tolerance across the operating frequency range of the coupler. Coupled-line hybrid couplers include a pair of coupled transmission lines: a main (or "primary") line, which is the driven line connected to an input port, and a coupled (or "secondary") line, which can be terminated on its input, e.g., with a resistor to ground. The main line and the coupled line are not in galvanic contact, but are placed in close proximity to one another such that the two lines are coupled inductively and capacitively, and are configured such that the power in the coupled line flows in the opposite direction as the power on the main line.

The transmission lines of coupled-line hybrid couplers can be fabricated, for example, using microstrips. A microstrip is a planar electrical transmission line, consisting of a conducting strip separated from a ground plane by a dielectric layer known as the substrate, that can convey microwave-frequency signals and can be fabricated using existing technology.

In some coupled-line hybrid couplers, the coupled transmission lines are straight. To achieve sufficient coupling, such a straight-line geometry requires a ground plane that is much farther away from the coupled transmission lines than they are from each other, for example, at least four times farther away. Straight-line hybrid couplers therefore require dielectric thicknesses that are not often available as a practical matter for implementation on a chip. Because the coiled coupled-line hybrid couplers disclosed herein are designed and configured to operate in the superconducting realm, they are able to make use of coiled geometries that can yield higher coupling strength without needing impractically thick dielectric layers. Absent such superconducting operation and configuration therefor, the requisite thin linewidths would result in too much power loss for the couplers to be effective. Transmission lines implemented in copper, for example, would be too lossy to implement a coiled coupled-line hybrid coupler of the type disclosed herein.

Whereas a conventional coupled-line hybrid coupler employs two straight coupled transmission lines, the present application discloses a coupler that wraps the two coupled lines into a series of tight coils to provide stronger coupling in less space. The coils can be biplanar coils, meaning that they consist of connected planar traces that reside on two distinct roughly parallel planes. Because of the particular way that the coils are wrapped, e.g., with parallel transmission line traces spiraling inward to the coil center where both traces have a switch in plane and then unwind in the same rotational direction in which they were wound, the primary line can be coupled to the secondary line above it as well as on either side. Likewise, the secondary line can be coupled to the primary line on three sides instead of just one, as in a conventional straight-line coupler. The widths and spacing of the coiled lines, as well as the spacing between the lines and grounded via walls, precisely determines the impedances of the common (i.e., even) and differential (i.e., odd) modes of the coupler, allowing the response of each coiled coupled-line hybrid coupler to be tuned, during manufacture, to the coupler's particular application. The disclosed configuration thereby provides finer control of operational parameters than a conventional straight-line coupler design.

A single coil of the two transmission lines can be tuned to have the required impedances, but is generally not long enough to act as a hybrid coupler for the frequency bands that are typically of interest (e.g., between about five and twenty gigahertz). A coiled coupled-line hybrid coupler therefore can be implemented as a series array of cells having one or more transmission line coils in each cell. The individual coils or individual cells can be efficiently simulated in a commercial finite element method solver for electromagnetic structures, such as HFSS (High Frequency Structure Simulator) by Ansys or FEM Element by Keysight Technologies, to calculate their common (i.e., even) and differential (i.e., odd) mode impedances. The S-parameters of a single coil or single cell can be exported from the finite element method solver (e.g., HFSS) to an electronic design automation software for microwave applications, such as Advanced Design System (ADS) by Keysight Technologies, to calculate the response of a serial array of coils or cells, and thus to simulate the response of an entire hybrid structure (i.e., a series array of coils or cells). Such simulations have demonstrated that coiled coupled-line hybrid couplers of the type described herein can be achieved with an octave bandwidth with an about ±0.5 dB power tolerance and an about ±1° phase tolerance over a large frequency band of interest.

FIG. 1 illustrates an example superconducting system 100 having coiled coupled-line hybrid coupler 102 and three microwave objects 104, 106, 108. As examples, system 100 can be a quantum computer, an RQL system or circuitry, a phase shifter, or driving circuitry for an RQL clock network. System 100 can be fabricated on a chip using superconducting circuit fabrication techniques such as deposition and etching. Input signal power provided to coupler 102 from first microwave object 104 via first port 110 (which can be considered the input port) is divided about evenly between outputs over ports 112, 114 to second and third microwave objects 106, 108, respectively. By "about evenly," it is meant that there may be some error tolerance, e.g., ±1 dB, e.g., ±0.5 dB %, over the frequency range of interest, as discussed herein. Coupler 102 includes two transmission lines, a coiled primary line 116, which can also be referred to as a main line, and a coiled secondary line 118, which can also be referred to as a coupled line. Coupler 102 also includes a ground plane 120.

Transmission lines 116, 118 are arranged such that they are not in galvanic contact with each other, but are spaced sufficiently close together along a sufficient portion of the length of each, herein termed the coupling length, so as to provide functionally significant capacitive and inductive coupling. Transmission lines 116, 118 are not straight parallel lines, but are coiled together. Transmission lines 116, 118 can fabricated to be substantially planar, and can, for example, be fabricated as microstrip lines, and/or can be fabricated of a superconducting metal, e.g., niobium or aluminum. Transmission lines 116, 118 can, for example, each be of between one hundred nanometers and ten micrometers in cross-sectional width, e.g., between five hundred nanometers and 3.5 micrometers in width, e.g., between nine hundred nanometers and 2 micrometers in width, e.g., about one micrometer in width. Transmission lines 116, 118 can be arranged to be spaced apart from each other over the coupling length at a distance of between one hundred nanometers and ten micrometers, e.g., between two hundred nanometers and one micrometer, e.g., between 250 and 500 nanometers, e.g., about 300 nanometers. This spacing between transmission lines will herein be termed the coupling distance, and it will be appreciated that this coupling distance may vary slightly over the coupling length as a result of manufacturing tolerances, corner turns in the coils, etc., but at least in some examples can be substantially uniform over the coupling length, that is, sufficiently uniform such that any deviations are not appreciable to the functioning and performance parameters of the coupling, e.g., such that no performance parameter of the coupler 102 is affected by any disuniformity in coupling distance over the coupling length by greater than ten percent, e.g., by greater than five percent. The coupling distance can, for example, be on the order of the distance between the transmission lines and the ground plane, which distance will herein be termed the ground plane separation distance. In some examples, the ground plane separation distance is between about one hundred nanometers and about five hundred nanometers, e.g., about two hundred nanometers.

Figure 2:
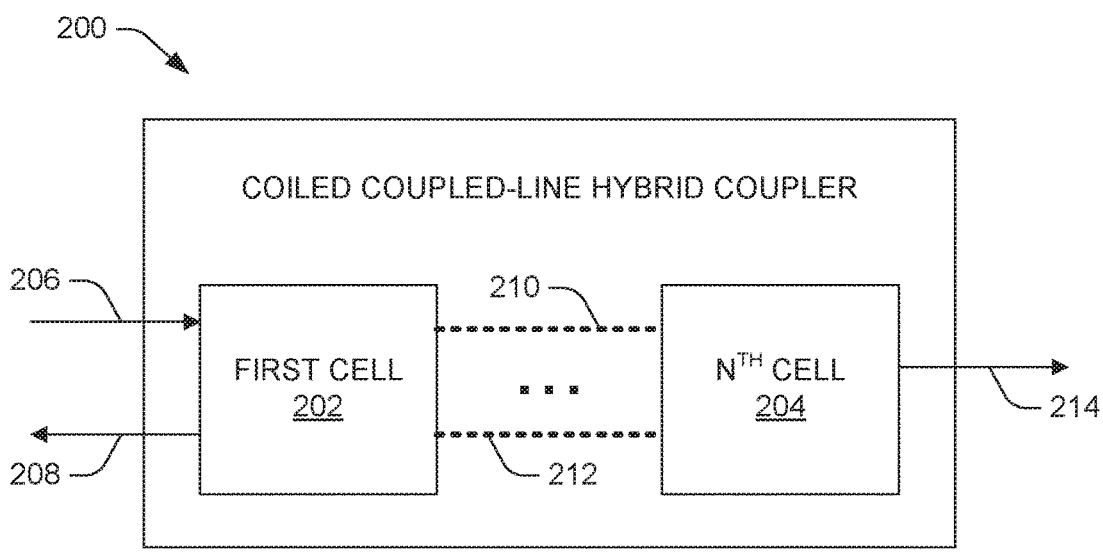
FIG. 2 is a block diagram of an example coiled coupled-line hybrid coupler.

FIG. 2 illustrates an example coiled coupled-line hybrid coupler 200 that can correspond to coupler 102 in the superconducting system 100 of FIG. 1. Coupler 200 includes a plurality of cells 202 through 204, N in number, each cell containing a coiled portion of a main transmission line 210 and a coiled portion of a coupled transmission line 212 of a hybrid coupler. The two transmission lines can remain at a substantially uniform coupling distance throughout each cell, as well as between cells. Coupler 200 can have three ports 206, 208, 214. An input signal can be provided to first cell 202 via a coupler input port 206 and output signals can be delivered from coupler output ports 208, 214. As shown, a first coupler output port 214 can be connected to $N^{th}$ cell 204 and a second coupler output port 208 can be connected to first cell 202. Thus, the ports 206, 214, 208 can correspond to ports 110, 112, 114 shown in FIG. 1, respectively. The ellipsis drawn in the middle of coupler 200 indicates that the coupler can have an arbitrary integer number of cells, two or greater, arranged in serial fashion. Each cell can be connected to the next by straight runs of transmission lines 210, 212. For example, coupler 200 can have more than ten cells, e.g., fifteen cells. Each cell 202 through 204 can have substantially the same configuration and construction as each other cell. Each cell 202 through 204 in coupler 200 may include one or multiple transmission line coils. For example, each cell 202 through 204 can include two coils. Coupler 200 can also have a fourth port, not shown, which can be appropriately terminated, e.g., with a resistance to ground, or can be used as an output port in some applications.

Figure 3:
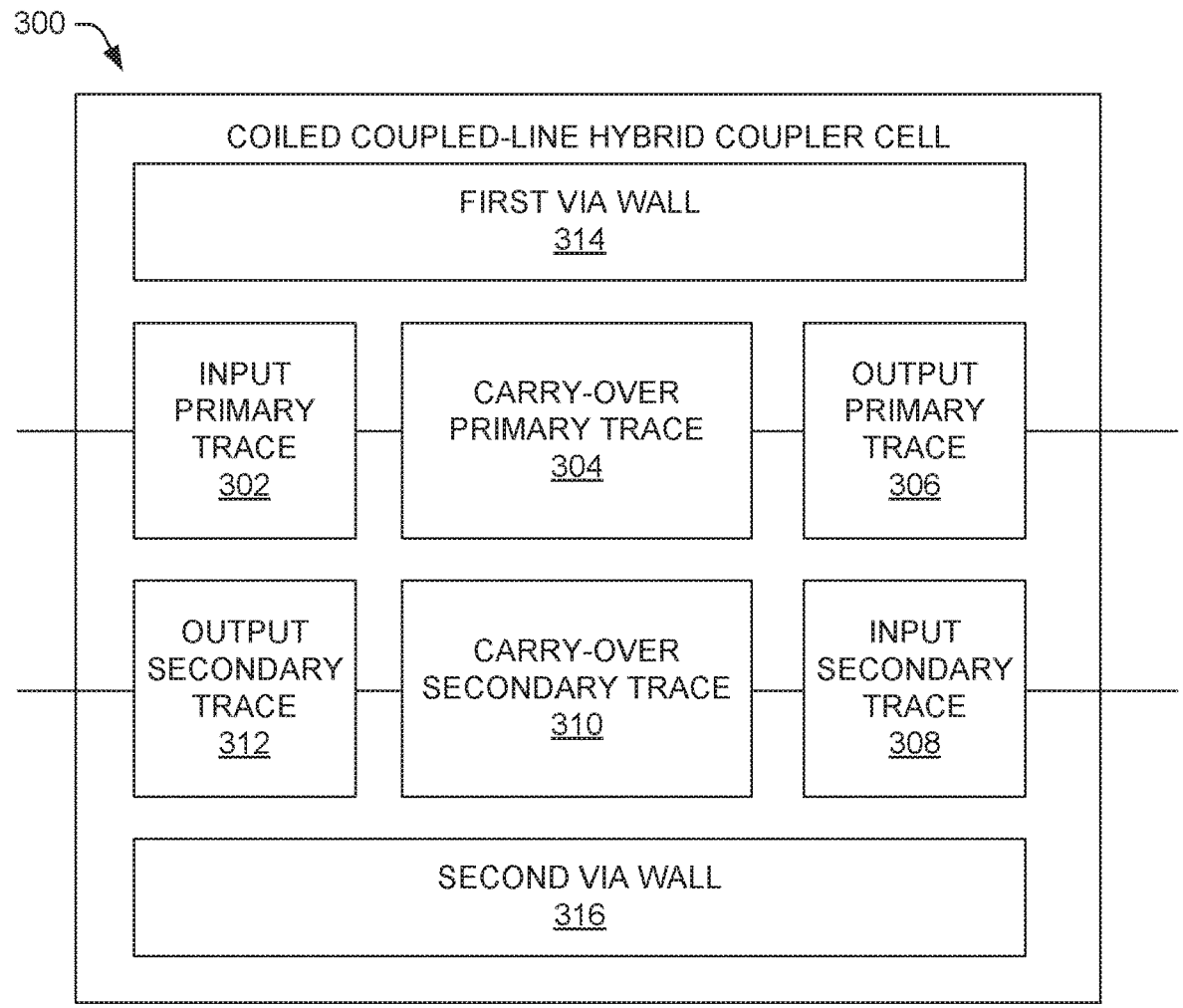
FIG. 3 is a block diagram of an example coiled coupled-line hybrid coupler cell.

FIG. 3 illustrates an example coiled coupled-line hybrid coupler cell 300 that can correspond to any of cells 202 through 204 in the coupler 200 of FIG. 2. A first coiled transmission line in cell 300 can consist of a substantially planar input primary trace 302, a substantially planar carry-over primary trace 304, and a substantially planar output primary trace 306. Substantially planar traces 302, 304, 306 can be fabricated to reside on different planes. For example, input primary trace 302 and output primary trace 306 can reside on a first plane while carry-over primary trace 304 can reside on a second plane. As indicated by the lines joining them in FIG. 3, the input primary trace 302 can galvanically contact the carry-over primary trace 304, e.g., at a contact pad that spans planes. Similarly, the carry-over primary trace 304 can galvanically contact the output primary trace 306, e.g., at a contact pad that spans planes. The carry-over traces 304, 310 are so named herein because they each galvanically connect a respective input trace to a respective output trace, which are otherwise not galvanically connected.

A second coiled transmission line in cell 300 can consist of a substantially planar input secondary trace 308, a substantially planar carry-over secondary trace 310, and a substantially planar output secondary trace 312. Like the traces 302, 304, 306, substantially planar traces 308, 310, 312 can also be fabricated to reside on different planes. For example, input secondary trace 308 and output secondary trace 312 can reside on one plane, e.g., the aforementioned first plane, while carry-over secondary trace 310 can reside on another plane, e.g., the aforementioned second plane. As indicated by the lines joining them in FIG. 3, the input secondary trace 308 can galvanically contact the carry-over secondary trace 310, e.g., at a contact pad that spans planes. Similarly, the carry-over secondary trace 310 can galvanically contact the output secondary trace 312, e.g., at a contact pad that spans planes.

Each of the traces 302, 304, 306, 308, 310, 312 can be substantially spiral in shape, and such a spiral can be, as examples, a circular, oval, triangular, square, rectangular, pentagonal, hexagonal, heptagonal, octagonal, nonagonal, or decagonal in shape, when viewed in a plan view. Each spiral can have one or more turns, e.g., two turns, a turn being defined as one complete rotation around the spiral (as viewed in a plan view), and not as a mere change in longitudinal direction of a trace (e.g., at the "corners" of a spiral or coil).

The second plane can be above or below the first plane and the coils of the traces can be configured such that the carry-over primary trace 304 of cell 300 substantially tracks the alignment of an overlying or underlying input or output secondary trace 308, 312, and similarly, such that the carry-over secondary trace 310 substantially tracks the alignment of overlying or underlying input or output primary traces 302, 306. By "substantially tracks the alignment," here it is meant that allowance is made not only for minor fabrication variations but also for any crossovers made necessary by coil topology, as will become evident with regard to FIGS. 4 and 6. The two carry-over traces 304, 310 can also be straight and substantially parallel to each other, rather than coiled, within cell 300 for a portion of the coupling length within cell 300, e.g., between two coils in the cell.

Cell 300 can be configured to have connectivity with other cells and/or with input/output ports and/or terminations. As indicated by the horizontal connector lines at the left and right of cell 300 in FIG. 3, the input primary trace 302 can be connected to the output primary trace of an adjacent cell, the output primary trace 306 can be connected to an input primary trace of an adjacent cell, the input secondary trace 308 can be connected to an output secondary trace of an adjacent cell, and the output secondary trace 312 can be connected to an input secondary trace of an adjacent cell. Alternately, where the cell is the first or last in a serial chain of cells, the connections can be to corresponding input or output ports or terminations as appropriate. Cell 300 can also be fabricated to include via walls 314, 316 that can line the edges of the traces. The via walls can be grounded, and can each consist of a built-up wall around the two transmission lines to provide shielding to circuitry outside of the coupler. The via walls also provide additional capacitance to the lines along the outer edges of the coils. The via walls can be made, for example, of copper, iron, aluminum, nickel, stainless steel, or of the same superconducting metal used to fabricate the transmission lines.

The traces of cell 300 can be configured as one or more spirals to form a number of coils, e.g., as two coils per cell. The coils can be rounded in shape such that the traces have substantially no straight lines and no sharp (e.g., right) angles or path discontinuities. For ease of fabrication, however, the coils can consist of straight-path trace segments that turn at angles, e.g., right angles. As such, in different examples, as viewed in a plan view (i.e., from "above"), the coils can be substantially round, oval, triangular, rectangular, square, pentagonal, hexagonal, heptagonal, octagonal, nonagonal, decagonal, etc. It would not be possible to illustrate or describe herein every spiral or coil shape and configuration, but the designs of the substantially square coil examples illustrated in FIGS. 4 and 6, having right-angle trace turns, can be extended to other shapes and configurations by modifying, among other topological parameters, the angles, trace segment lengths, numbers of segments in the trace spirals, number of turns in the spirals, number of layers in the coils, trace widths and thicknesses, etc.

The coils or cells can be designed such that the total distance of a transmission line in any one coil or cell is a small fraction of a wavelength, e.g., less than half a wavelength, e.g., less than a quarter of a wavelength, e.g., less than 0.1 wavelength. In general, the larger the coil, either in number of turns or in absolute size, the less effective the coil becomes, in part because coils of many turns (e.g., more than two) exhibit some amount of unwanted coupling between lengthwise very distant portions of the lines, and in part because a larger coil results in longer runs of transmission line pairs at a spiral periphery which ever closer approximate in effect the coupling of a parallel-line coupler, the larger the spiral. Resultantly, the performance of serialized smaller coils has been shown to be better than the performance of singular larger coils.

Figure 4:
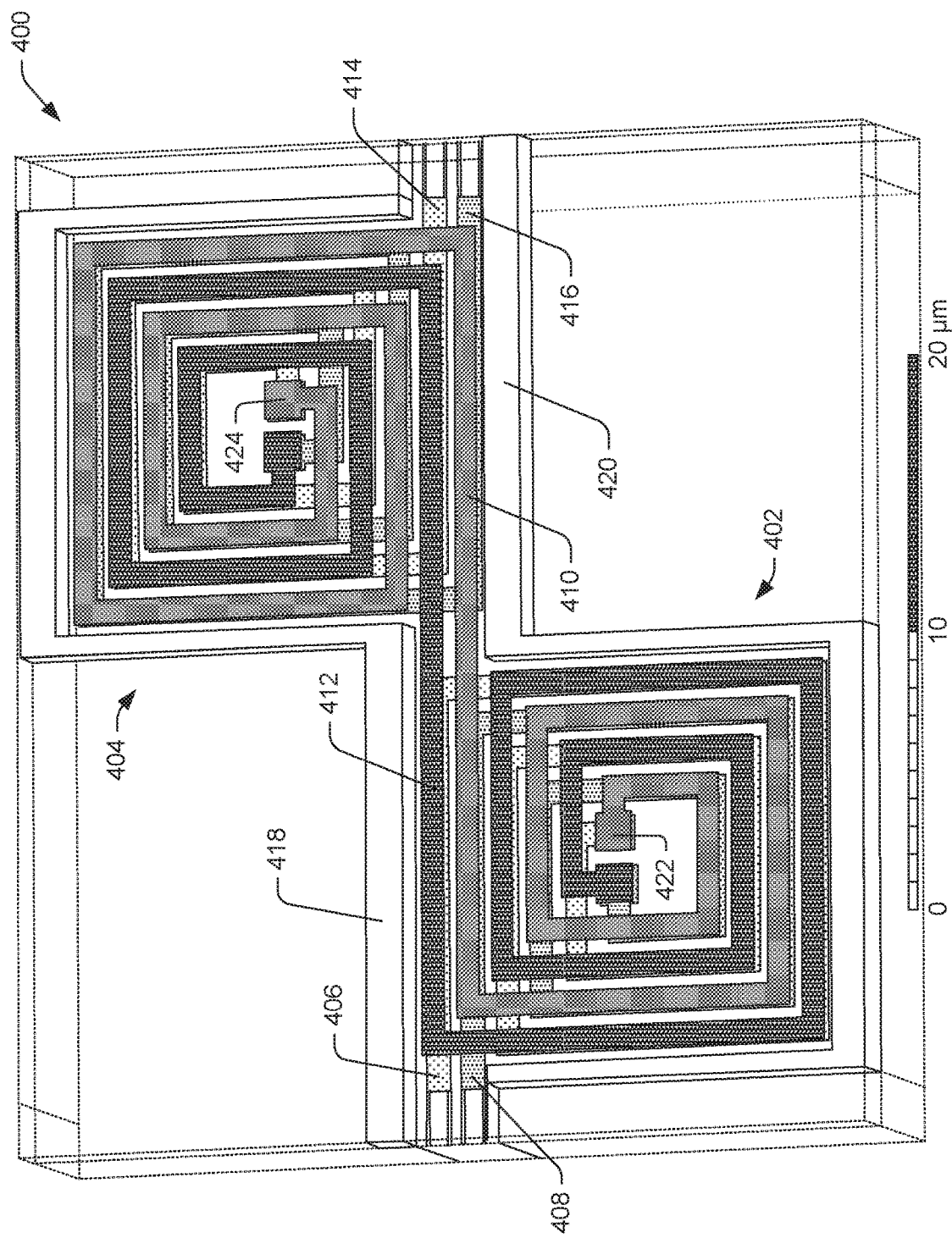
FIG. 4 is a perspective view of an example coiled coupled-line hybrid coupler cell.

FIG. 4 illustrates an example coiled coupled-line hybrid coupler cell 400 that can correspond to the cell 300 schematically illustrated in FIG. 3. The cell 400 as illustrated has two coils 402, 404. An indicator of scale is shown near the bottom of FIG. 4. Each coil can be, for example, between one and fifty micrometers in diameter, e.g., between ten and twenty micrometers in diameter, e.g., about fourteen micrometers in diameter. The planar size of the coil will depend on the widths and coupling distances of the transmission lines and the number of turns in the coil, which, as discussed herein, are tunable parameters to create couplers having different performance properties. Each coil can include two transmission lines and can consist of multiple electrically conductive traces that can fabricated to be substantially planar, and can, for example, be fabricated as microstrip lines, and/or can be fabricated of a superconducting metal, e.g., niobium or aluminum. Each transmission line can comprise multiple galvanically connected traces residing on distinct planes.

In the cell 400 of FIG. 4, first coil 402 can consist of first trace 406 on a lower plane, second trace 408 on the lower plane, third trace 410 on an upper plane that can, for example, be fabricated to be approximately the coupling distance above the lower plane, and fourth trace 412 on the upper plane. First trace 406 can correspond to input primary trace 302 in FIG. 3. Second trace 408 can correspond to output secondary trace 312 in FIG. 3. Third trace 410 can correspond to carry-over primary trace 304 in FIG. 3. Fourth trace 412 can correspond to carry-over secondary trace 310 of FIG. 3. Similarly, in the cell 400 of FIG. 4, second coil 404 can consist of third and fourth trace 410, 412 on the upper plane and fifth and sixth traces 414, 416 on the lower plane, which can correspond to output primary trace 306 and input secondary trace 308 in FIG. 3, respectively. Cell 400 can have via walls 418, 420 surrounding coils 402, 404, e.g., by a substantially uniform distance. The via walls can be grounded, and can each consist of a built-up wall around the two transmission lines to provide shielding to circuitry outside of the coupler. The via walls also provide additional capacitance to the lines along the outer edges of the coils.

Upper-plane traces can galvanically connect to lower-plane traces at connection points or contact pads 422, 424, which can be formed by thickening of the traces at designated points at the centers of coils 402, 404, such that the connection points or contact pads span plans and thus galvanically connect traces that are otherwise on distinct planes that can be about parallel. By "about parallel," it is meant that the planes are parallel with some error allowance made for minor fabrication deviations. In the illustration of FIG. 4, eight such thickenings form four contact pads, only two of which are labeled in FIG. 4. Consequently, traces 406, 410, 414 are all galvanically unified to form a first coiled transmission line, while traces 408, 412, 416 are all galvanically unified to form a second coiled transmission line that is inductively and capacitively coupled to the first transmission line. Thus, in some examples, the first transmission line consisting of traces 406, 410, 414 can correspond to primary line 116 of FIG. 1 and the second transmission line consisting of traces 408, 412, 414 can correspond to secondary line 118 of FIG. 1, or, in other examples, vice-versa. The traces, and therefore the two transmission lines they compose, are coiled together.

As can be seen viewing FIG. 4 from left to right, input trace 406 is coiled in a clockwise direction on the lower plane of coil 402 until it galvanically joins with its upper-plane carry-over trace 410 at contact pad 422. Carry-over trace 410 then uncoils, still in a clockwise direction, on the upper plane of coil 402, and re-coils, now in a counter-clockwise direction, on the upper-plane of coil 404, until it galvanically joins with lower-plane output trace 414, which continues the counter-clockwise uncoiling on the lower plane of coil 404. Thus, one transmission line (e.g., the primary transmission line of cell 400) is formed. Viewing FIG. 4 from right to left, input trace 416 is coiled in a clockwise direction on the lower plane of coil 404 until it galvanically joins with its upper-plane carry-over trace 412 at its own connection pad (unlabeled). Carry-over trace 412 then uncoils, still in a clockwise direction, on the upper plane of coil 404, and re-coils, now in a counter-clockwise direction, on the upper-plane of coil 402, until it galvanically joins with lower-plane output trace 408, which continues the counter-clockwise uncoiling on the lower plane of coil 402. Thus, another transmission line (e.g., the secondary transmission line of cell 400) is formed. Each coil 402, 404 in the example cell 400 of FIG. 4 has about two turns, but other examples can have more or fewer turns. (At least more than one full turn is required to satisfy the definition of a spiral arrangement.) In view of the illustrated cell design 400, coils can be designed such that each trace is within the coupling distance to a trace of the other transmission line at either side of the trace and also above or below the trace for a majority of the coupling length. By contrast, in a parallel-line coupler, each transmission line is coupled to the other transmission line on only one side.

In cells having multiple coils, the coils can be spatially displaced from each other in two dimensions along the plane of the chip on which the coils are fabricated. Thus, in the example cell 400 of FIG. 4, second coil 404 is displaced from first coil 402 in a first dimension by approximately the diameter of either coil (the two coils 402, 404 are identically sized in the illustrated example), e.g., within 10%, e.g., within 5%, and is displaced from first coil 402 in a second dimension by approximately the diameter of either coil, e.g., within 10%, e.g., within 5%. The relative displacement can be measured, for example, from the coil centers.

Figure 5:
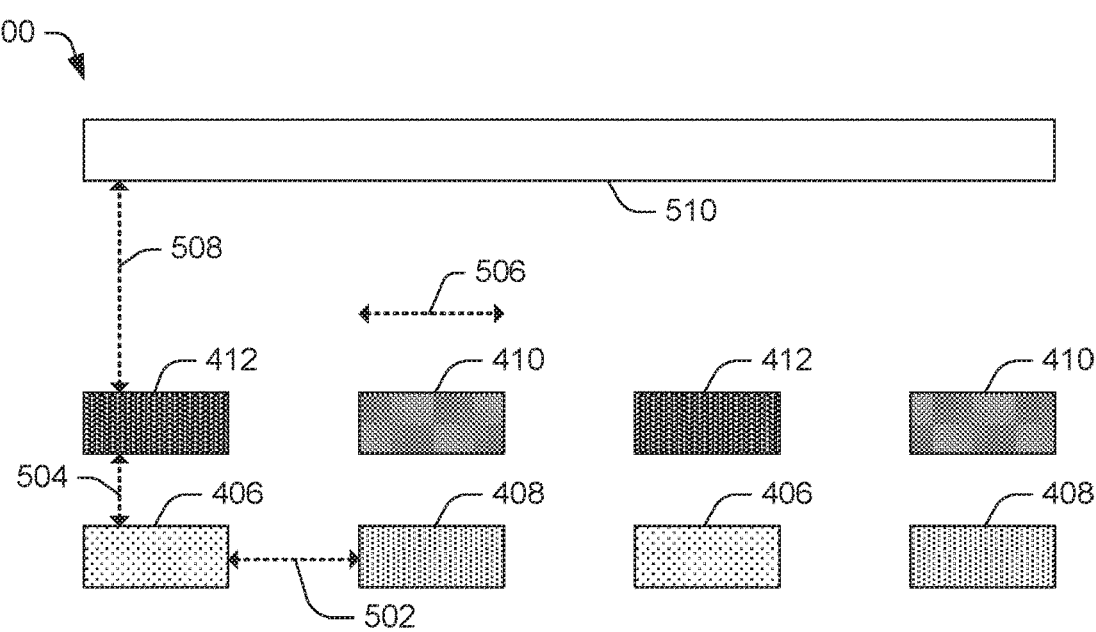
FIG. 5 is a cross-sectional view of the traces and ground plane of one half of a coil of FIG. 4.

FIG. 5 shows a half-coil transverse cross-section 500 of traces, i.e., in one half of an example transmission line coil, such as coil 402 from FIG. 400. In the illustrated cross-section 500 through the transverse plane of the transmission lines, i.e., in a plane normal to the tangential longitudinal axis of a transmission line, said longitudinal axis being either coincident or exactly opposite to the direction of current flow, it can be seen that each turn of each coil has two traces, one from each transmission line, on each plane, making for eight cross-sections of the traces in total. It can also be observed that traces of different transmission lines are separated by a horizontal coupling distance 502 and by a vertical distance 504 that is approximately equal to or slightly less than the horizontal coupling distance 502. Each trace can have a cross-sectional width 506 of, e.g., about one micrometer. The coupling distances 502, 504 can, for example, be on the order of the ground plane separation distance 508 between the transmission lines and the ground plane 510. The ground plane separation distance 508 can be less than four times either of the coupling distances 502, 504. For example, the ground plane separation distance 508 can be less than two micrometers, e.g., less than 1.5 micrometers, e.g., less than 500 nanometers. In some examples, the space between traces is filled with a dielectric material, e.g., silicon dioxide.

It can further be observed in cross-section 500 that each of the four cross-sections of the traces in the middle of the cross-section 500, two from the top plane and two from the lower plane, are surrounded by traces of the opposite transmission line on three sides all within the coupling distance 502. For example, the cross-section portion of output secondary-line trace 408 on the lower plane at middle-left is surrounded by input primary-line trace portions 406 on its left and right sides on the lower plane, and by carry-over primary-line trace portion 410 above it on the upper plane. As another example, the cross-section portion of carry-over secondary-line trace 412 on the upper plane at middle-right is surrounded by carry-over secondary-line trace portions 410 on its left and right sides on the upper plane, and by input primary-line trace portion 406 below it on the lower plane. Thus, four of the trace cross-sections are each within the coupling distance from three other adjacent traces of an opposite transmission line, when viewed in the half-coil transverse cross-section. The coupler described herein thereby provides coils wherein one of the primary and secondary transmission lines is surrounded by and within a coupling distance from the other of the transmission lines on at least three sides as viewed from a transverse-plane cross-section of the one transmission line.

Figure 6:
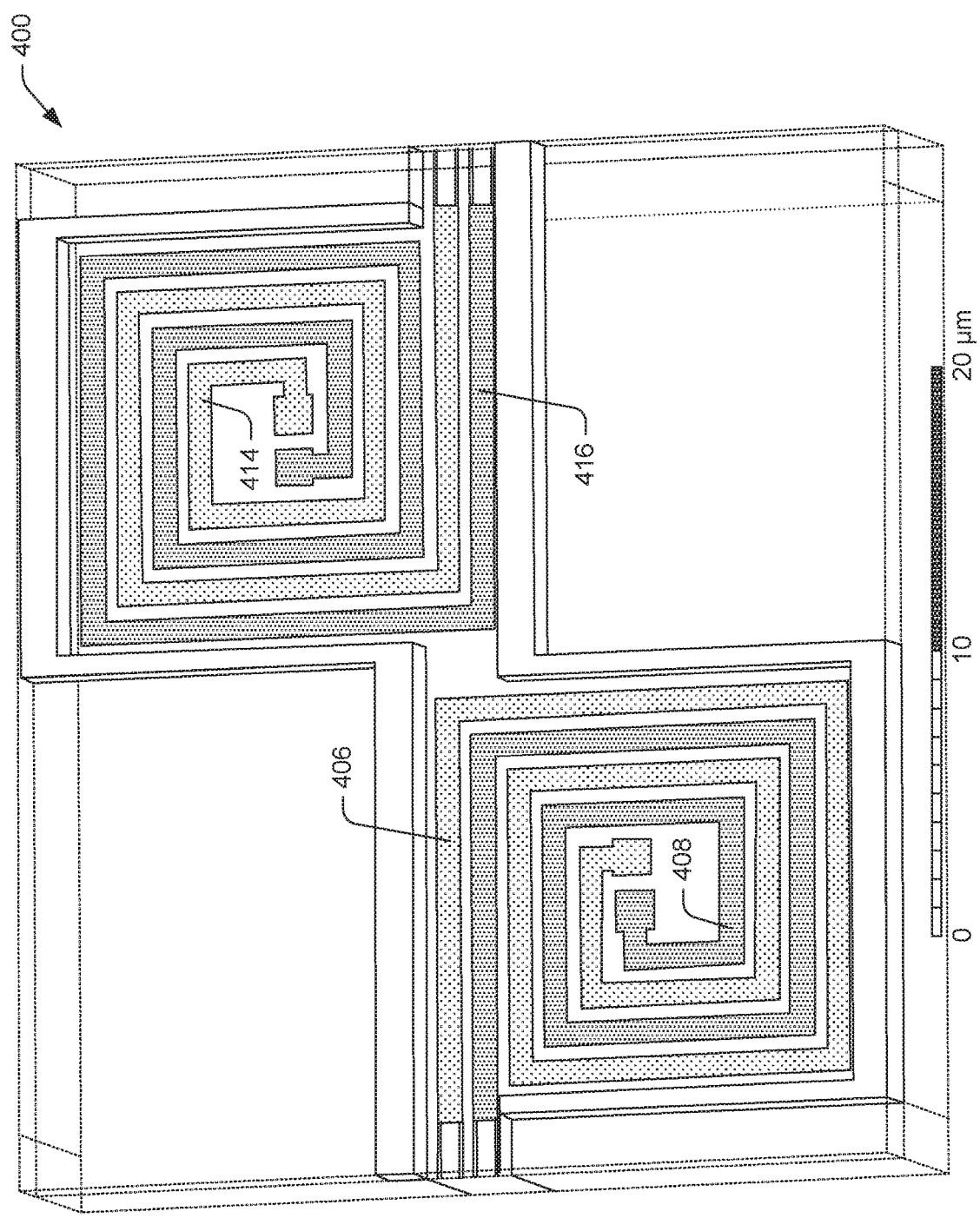
FIG. 6 is a perspective view of an example coiled coupled-line hybrid coupler cell with upper-plane transmission line traces removed so as to show lower-plane transmission line traces.

The perspective view of FIG. 6 is identical to FIG. 4, but with the upper-plane traces (i.e., the carry-over traces of cell 400) removed so as to better show only the lower-plane traces, which are otherwise mostly obscured in FIG. 4.

With reference to FIGS. 4 and 6, multiple cells 400 can be connected in series. For example, the first trace 406 of cell 400 can galvanically connect to the fifth trace of a preceding cell, the fifth trace 414 of cell 400 can galvanically connect to the first trace of a succeeding cell, the second trace 408 of cell 400 can galvanically connect to the sixth trace of a preceding cell, and the sixth trace 416 of cell 400 can galvanically connect to the second trace of a succeeding cell. Multiple serial cells can be fabricated together (e.g., on a single chip) such that the transmission lines are substantially continuous, i.e., such that there is no discontinuity at the traces between cells and thus no need for any special connection feature or modification to traces at the interfaces between cells.

FIG. 7 shows such serial arrangement in plan view by illustrating a portion 700 of a coiled coupled-line hybrid coupler, with a two-coil part 702 thereof corresponding to a single cell, the trace pattern of which cell repeats in a serial fashion in either direction. The plan view of FIG. 8 is identical to FIG. 7 but with the upper-plane traces (i.e., the carry-over traces of each cell) removed so as to better show only the lower-plane traces, which are otherwise mostly obscured in FIG. 7.

Where cell 400 in FIG. 4 is the first or last in a serial chain of cells, the ends of input or output traces can connect to input or output ports or terminations, as appropriate. In the illustrated example, third and fourth traces 410, 412 are confined to cell 400 and do not directly galvanically connect outside of cell 400, except through the other traces 406, 408, 414, 416.

FIG. 9 illustrates an example coiled coupled-line hybrid coupler circuit 900 as a simulation schematic, which can be used to produce plots characterizing its behavior, as shown in FIGS. 10-11. Hybrid coupler 900 is built of cells 902 (in the illustrated instance, fifteen such cells), each cell 902 corresponding, for example, to cell 300 of FIG. 3 or cell 400 of FIG. 4. Within the operating frequency range, power delivered to input port 904 is divided roughly evenly between a first output port 906 on the main transmission line and a second output port 908 on the coupled transmission line, as shown by FIG. 11, with an about 90° phase difference between the two output signals. A fourth port 910, the input port of the coupled line, can in three-port implementations be terminated with a resistance to ground, or, as discussed in greater detail below, can be used to provide a single output for a phase shifter when ports 906 and 908 are connected to tunable resonators.

The S-parameter plot of FIG. 10 effectively shows the amplitudes of the two outputs as a function of frequency, and the plot of FIG. 11 shows the phase difference between the two outputs as a function of frequency over the same spectrum, i.e., between five and ten gigahertz. In FIG. 10, plot 1002 shows, in decibels, the portion of input power delivered to port 906, i.e., the output of the transmission line driven by the input (aka the "main line" or "primary line"), and plot 1004 shows the portion of the input power delivered to port 908, i.e., the output of the undriven (aka "coupled"

or "secondary") transmission line. An S-parameter measure of 0 dB in FIG. 10 would indicate that all of the input power comes out of the plotted output port. A −10 dB measure would indicate that a tenth of the input power comes out of the plotted output port. An about −3 dB measure would indicate that half the power provided to the input port is observed at the plotted output port. A plot like that of FIG. 10 for an ideal hybrid coupler would thus show both of the output port plots as horizontal lines at about −3 dB across the entire frequency band.

FIG. 10 shows plots at about −3 dB±0.4 dB over the simulated frequency band, indicative of what for many applications is very satisfactory power splitting performance of the coiled coupled-line hybrid coupler disclosed herein. A weak coupling is manifest in the graph of FIG. 10 by low values of plot 1004 and high values of plot 1002. As can be seen from plots 1002, 1004 in FIG. 10, at very low frequencies (e.g., below five gigahertz) and very high frequencies (e.g., above ten gigahertz), proportionally very little input power is coupled to the undriven line. Within the plotted operating frequency range, however, both the main-line output power 1002 and the coupled-line power 1004 fall within about −3.5 dB and −2.8 dB. A strong coupling is manifest in the graph of FIG. 10 by high values of plot 1004 and low values of plot 1002. In the middle of the operating range, at about 7.5 GHz, the quarter wavelength is matched such that a quarter wave fits inside the coupler device 900, and maximum coupling is observed. That is, a large portion of the input power is transferred the coupled line, so that the power 1002 on the direct-transmission line is comparatively low, but the power 1004 on the coupled line is comparatively high. Coupling is most even at the crossings of plots 1002, 1004 at around 5.8 GHz and 9.2 GHz.

Plot 1102 in the frequency diagram of FIG. 11 shows the difference in phase between output signals at output ports 908 and 906, and in particular shows a 90° phase separation between the output signals at an operating frequency of about nine gigahertz, with only ±1° error between six and ten gigahertz. Thus, the simulated coiled coupled-line hybrid coupler circuit 900 produces phase separation between outputs of very close to 90° for the whole operating range of the circuit. The phase difference is greatest at higher frequencies and least at lower frequencies.

Figure 12:
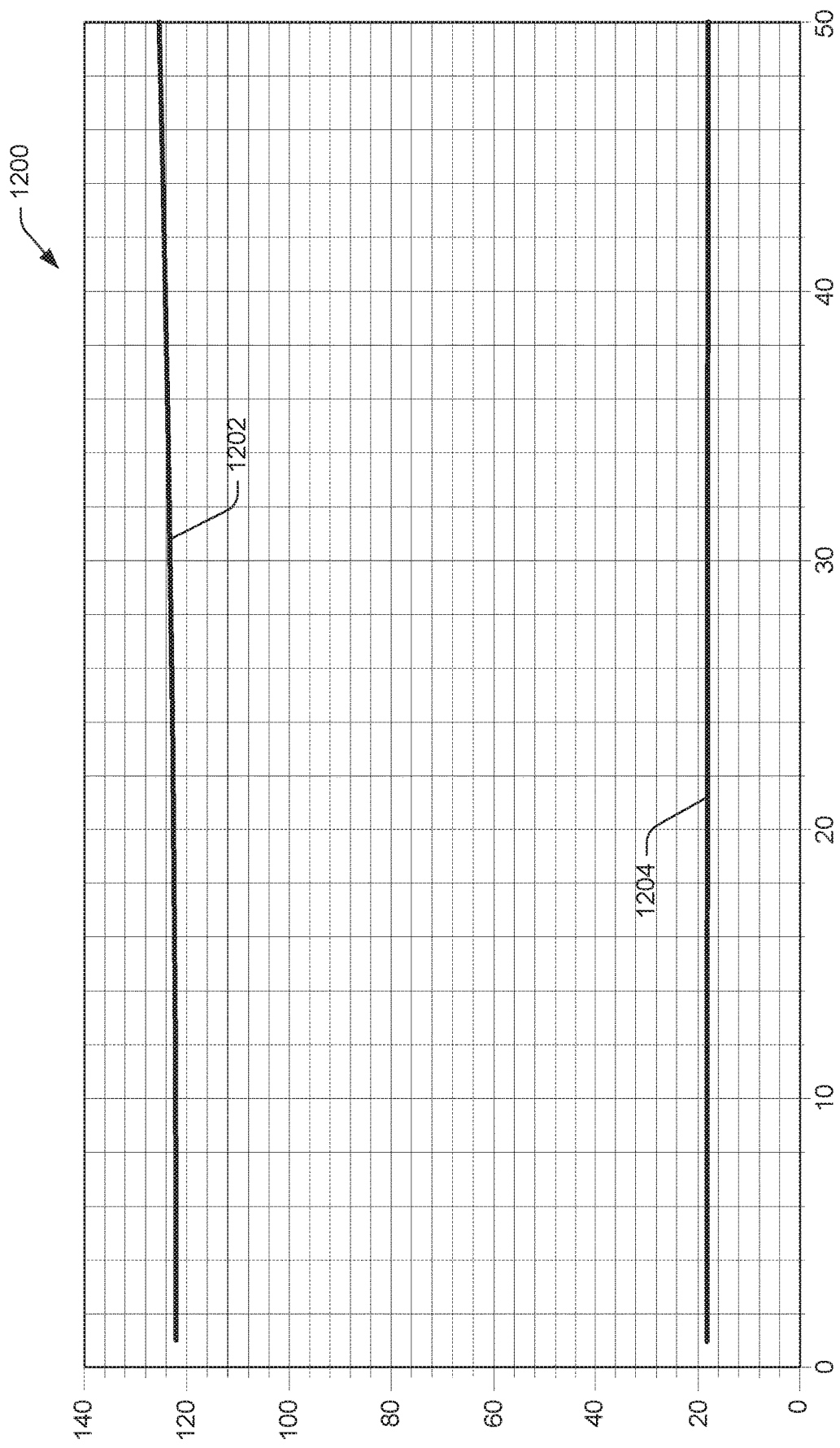
FIG. 12 is a graph showing the even and odd mode impedance difference of a hybrid coupler cell like that shown in FIG. 4.

FIG. 12 plots the even-mode impedance 1202 (also termed the common-mode impedance) and the odd-mode impedance 1204 (also termed the differential-mode impedance) of one cell of the coiled coupled-line hybrid over a wide frequency range, as produced by HFSS, for a cell as shown in FIG. 4. The vertical axis is shown in ohms and the horizontal axis is shown in gigahertz. As desired of such a coupler, the plot indicates an even-mode impedance of about 120 ohms, and an odd-mode impedance of about 20 ohms, for the operating range of the hybrid coupler cell. These impedances can be tuned during design and fabrication by adjusting the widths of the transmission lines and their coupling distances (i.e., the spacings between the transmission lines). Effective coupling is reduced as the odd and even mode impedances get closer together and increased as they get further apart. For example, if both the odd and even more impedances are both about 50 ohms, the coupler will exhibit approximately zero effective coupling. The coupler will exhibit about equal coupling at about the 20 ohm/120 ohm range for odd/even impedances.

Aside from by adjusting the transmission line widths and coupling distances, the performances, other design aspects of the couplers described herein can also be modified or adjusted so to tune one or more coupler performance parameters. For example, the number of turns in the coils can be increased or decreased, and the number of total coils or total cells in the coupler can be increased or decreased. In general, the more coils or cells in the coupler, the lower the frequency at which the hybrid coupler produces maximum coupling. Thus, for example, if a ten-cell design results in a ten-gigahertz hybrid coupler, a twenty-cell design can result in a five-gigahertz hybrid coupler. As FIG. 10 shows, the fifteen-cell design 902 of FIG. 9 exhibits maximum coupling at about 7.5 GHz. Operation ranges in the hundreds of megahertz or lower can potentially be achieved by serializing hundreds of cells.

Figure 13:
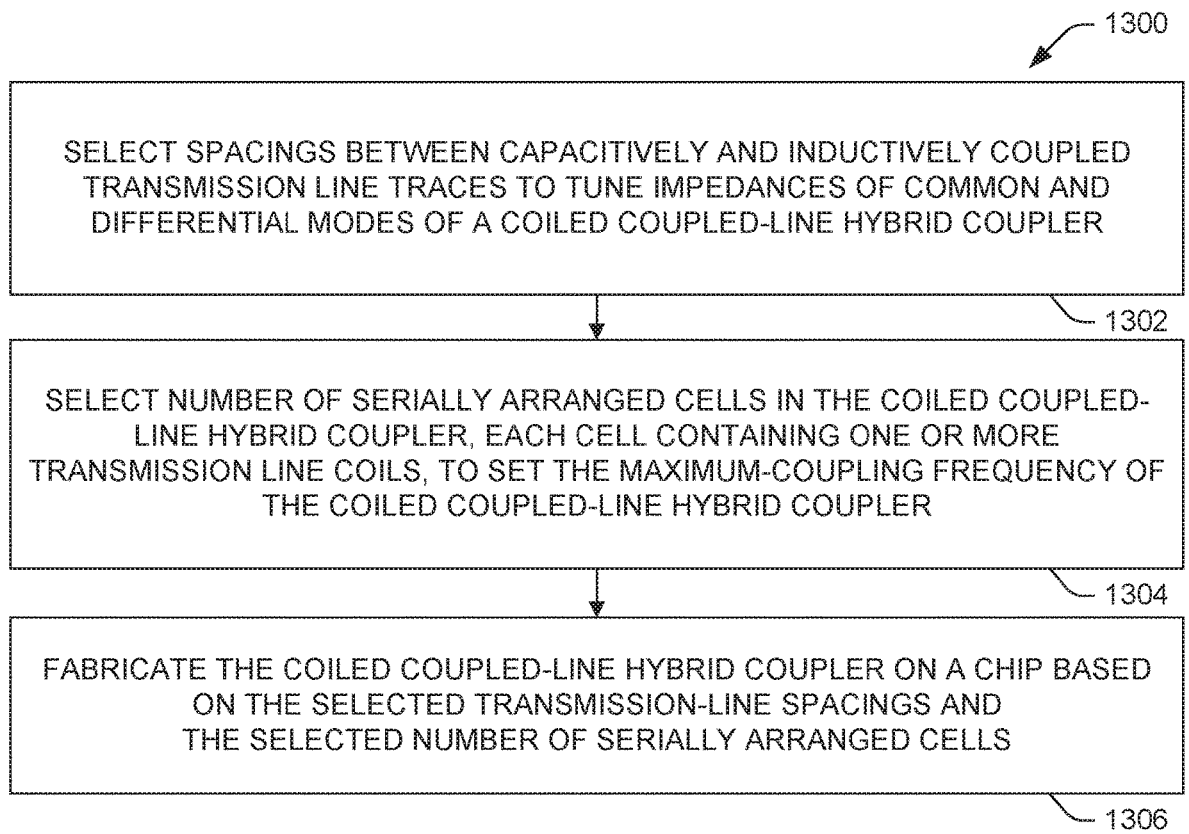
FIG. 13 is a flow diagram of an example method of designing a coiled coupled-line hybrid coupler.

FIG. 13 shows a method 1300 of making a coiled coupled-line hybrid coupler tuned for a particular microwave application. The spacings between capacitively and inductively coupled transmission line traces can be selected (e.g., chosen, determined, or adjusted) 1302 to tune impedances of common and differential modes of a coiled coupled-line hybrid coupler. These spacings can be substantially uniform over the coupling length of the transmission lines. Such spacings can be the aforementioned coupling distances and can comprise different distances in different spatial dimensions. As an example, the coupling distances can be selected such that impedances can be set to be between about fifteen ohms and about twenty-five ohms, e.g., about twenty ohms, for an odd mode, and between about one hundred ohms and about one hundred forty ohms, e.g., about one hundred twenty ohms, for an even mode of the coupler.

A number of serially arranged cells in the coiled coupled-line hybrid coupler can be selected (e.g., chosen, determined, or adjusted) 1304 to set the maximum-coupling frequency of the coiled coupled-line hybrid coupler. Each cell can contain one or more transmission line coils. As the term is used herein, a "maximum-coupling frequency" is the frequency at which a coupler achieves maximum coupling; the term does not mean a maximum frequency at which the coupler achieves any coupling. In either or both selections 1302 and 1304, circuit simulation as described herein can be used to select spacings and numbers of cells. The coiled coupled-line hybrid coupler can then be fabricated 1306, e.g., on a chip, based on the selected transmission-line spacings and the selected number of serially arranged cells. For example, the fabricated coupler can have the selected spacings and selected number of serially arranged cells. The coupler can be fabricated with superconductive transmission line traces. The method can further include selecting spacings between the transmission line traces and grounded via walls to tune the common and differential mode impedances, and fabricating of the coupler to have the via walls based on the selected spacings between the transmission line traces and the via walls.

Figure 14:
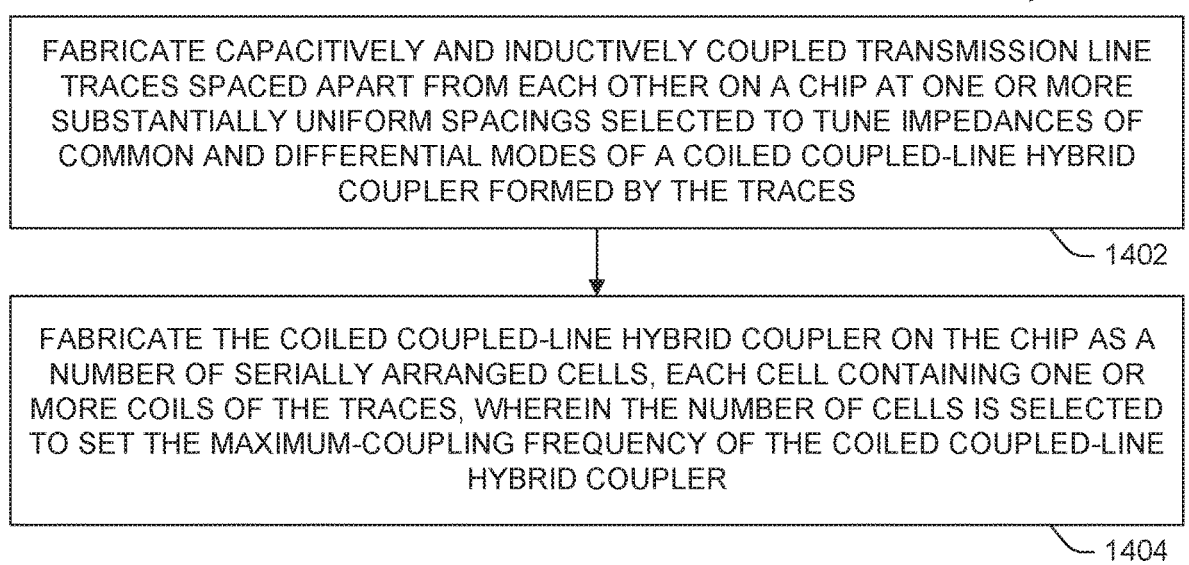
FIG. 14 is a flow diagram of an example method of fabricating a coiled coupled-line hybrid coupler.

FIG. 14 shows a method 1400 of fabricating a coiled coupled-line hybrid coupler on a chip, e.g., tuned for a particular microwave application. Capacitively and inductively coupled transmission line traces can be fabricated 1402 on the chip, spaced apart from each other at one or more substantially uniform spacings selected (e.g., chosen, determined, or adjusted) to tune impedances of common and differential modes of the coiled coupled-line hybrid coupler formed by the traces. Such spacings can be the aforementioned coupling distances and can comprise different distances in different spatial dimensions. As an example, the coupling distances can be selected such that impedances can be set to be approximately 20 ohms for an odd mode and 120 ohms for an even mode of the coupler. The coiled coupled-line hybrid coupler can be fabricated 1404 on the chip as a number of serially arranged cells, each cell containing one or more coils of the traces, wherein the number of cells is selected (e.g., chosen, determined, or adjusted) to set the maximum-coupling frequency of the coiled coupled-line hybrid coupler. As the term is used herein, a maximum-coupling frequency is the frequency at which the coupler achieves maximum coupling, and not a maximum frequency at which the coupler achieves coupling. The method can further include fabricating on the chip grounded via walls spaced apart from the traces at spacings selected to tune the common and differential mode impedances.

The coiled coupled-line hybrid couplers and methods disclosed herein provide greater design-time parameter tunability than straight-line coupler designs, and also solve the challenges associated with providing enough coupling in hybrid couplers on superconducting chips where the ground plane is too close to the transmission lines to achieve sufficient coupling with straight-line transmission lines. They can be incorporated into such superconducting electronic circuits as clock-distribution networks for RQL systems, as well as Josephson-based phase shifters and vector modulators.

With respect to RQL clock distribution network applications, the couplers disclosed herein can be used to feed in-phase ("I") and quadrature-phase ("Q") clock resonators in implementations of RQL devices that use a four-phase clock. In such devices, the power to an RQL circuit can be delivered on a four-phase power source, via an (0° phase) I resonator and a 90°-phase Q resonator. Because these are driven 90° degrees out of phase with one another, and because the hybrid couplers described herein can provide the desired 90°-phase-separated signals, a hybrid coupler as described herein can be used to feed inputs to the respective clock resonators.

A phase shifter can be built with a hybrid coupler as disclosed herein by connecting tunable elements to the two hybrid coupler outputs (e.g., ports 112 and 114 in FIG. 1, ports 214 and 208 in FIG. 2, or ports 1006 and 1008 in FIG. 10). Such a tunable element can be constructed of a superconducting quantum interference device (SQUID) resonator with a controllable DC bias, permitting the tuning of the resonant frequency of the element. A signal sent into the input port of the hybrid coupler splits and bounces off of these tunable elements, and comes out of the aforementioned fourth port of the hybrid coupler, i.e., the port that is, in three-port applications, terminated by a resistance to ground (e.g., port 910 in coupler 900 of FIG. 9), but which in this case is used as the sole output port of the phase shifter. The change in phase that the input signal thereby acquires can be modified depending on the tuned frequencies of the two tunable elements.

The hybrid couplers of the present invention can be used for a variety of superconducting electronics applications, with the cooled operating temperature varying by application. As examples, when a hybrid coupler as described herein is used in superconducting RF applications such as classical computing (e.g., using RQL circuitry) or radio astronomy, the chip on which the hybrid coupler is fabricated can be cooled to about four kelvins during operation and need not be operated at significantly lower temperatures. When a hybrid coupler as described herein is used in quantum computing applications, the chip on which the hybrid coupler is fabricated can be cooled to significantly lower temperatures, e.g., less than about 0.1 kelvins. The hybrid coupler circuits and methods as described herein are not limited to quantum computing applications.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A superconducting chip comprising:
   a ground plane;
   a coiled coupled-line hybrid coupler, the coupler comprising:
      a first port configured to receive an input signal from a microwave object;
      second and third ports amongst which the power of the input signal is split with about 90° phase separation;
      a primary transmission line galvanically connecting the first port and one of the two other ports, the primary transmission line being coiled in at least two biplanar coils in series with each other; and
      a coiled secondary transmission line galvanically connected with the other of the two other ports and not galvanically connected with the primary transmission line, the secondary transmission line coiled in the at least two biplanar coils and about uniformly spaced by a coupling distance from the primary transmission line in at least one planar dimension over a coupling length that includes the at least two coils, the secondary transmission line thereby being capacitively and inductively coupled to the primary transmission line;
   wherein, over at least a portion of the coupling length in each of the at least two coils, one of the primary and secondary transmission lines is surrounded by, and is substantially the coupling distance from, the other of the transmission lines on at least three sides, as viewed from a transverse-plane cross-section of the one transmission line,
   wherein the coils are between about one hundred nanometers and about five hundred nanometers separated from the ground plane, as viewed from the transverse-plane cross-section, and
   wherein the coupling distance is selected such that an odd-mode impedance of the coupler is between about fifteen ohms and about twenty-five ohms, and an even-mode impedance between about one hundred ohms and about one hundred forty ohms.

2. The chip of claim 1, comprising a series array of at least two cells, each cell comprising a portion of each of the primary and secondary transmission lines, a first of the at least two cells comprising the at least two coils, and each other of the at least two cells comprising at least two additional coils of the primary and secondary transmission lines.

3. The chip of claim 2, comprising a connected series array of at least ten of the cells, each of the cells comprising at least two coils of the primary and secondary transmission lines, wherein each coil in each cell is between ten and twenty micrometers in diameter.

4. The chip of claim 2, comprising a reciprocal quantum logic (RQL) circuit comprising the coupler and an RQL clock network, wherein the coupler is configured to provide signals separated in phase by 90° to the RQL clock network by respectively connecting in-phase and quadrature-phase resonators of the RQL clock network to different ones of the primary and secondary transmission lines at opposite ends of the coupler.

5. The chip of claim 2, wherein the coupler has an octave bandwidth with an about ±0.5 dB power tolerance and an about ±1° phase tolerance over a predefined frequency band.

6. The chip of claim 2, wherein, in each cell, the respective at least two coils of the primary and secondary transmission lines are substantially the same diameter, and a second of the respective at least two coils is displaced, in at least two planar dimensions, from a first of the respective at least two coils by about one coil diameter.

7. The chip of claim 6, wherein the respective at least two coils in each cell comprise planar, substantially square spiral traces of the primary and secondary transmission lines arranged on at least two different planes.

8. The chip of claim 7, further comprising, in each cell, two grounded via walls, wherein a first of the respective at least two coils is surround on at least three sides by a first of the via walls and on a fourth side by a second of the via walls, and a second of the respective at least two coils is surrounded on at least three sides by the second via wall and on a fourth side by the first via wall.

9. The chip of claim 1, wherein the primary and secondary transmission lines comprise substantially planar traces on two distinct planes, and, in each coil, the traces of the primary and secondary transmission lines are separated by a horizontal distance and by a vertical distance that are each equal to or less than the coupling distance, when viewed in half-coil transverse cross-section.

10. The chip of claim 9, wherein at least eight cross-sections of the traces in the half-coil transverse cross-section, and wherein at least four of the trace cross-sections are each within the coupling distance from three other adjacent traces of an opposite transmission line, when viewed in the half-coil transverse cross-section.

11. A method of fabricating a coiled coupled-line hybrid coupler on a chip, comprising:
fabricating capacitively and inductively coupled transmission line traces spaced apart from each other on the chip at one or more substantially uniform spacings selected to tune impedances of common and differential modes of the coiled coupled-line hybrid coupler formed by the traces to a predetermined common-mode impedance and a predetermined odd-mode impedance; and
fabricating the coiled coupled-line hybrid coupler on the chip as a number of serially arranged cells, each cell containing one or more coils of the traces, wherein the number of cells is selected to set a maximum-coupling frequency of the coiled coupled-line hybrid coupler to a predetermined frequency.

12. The method of claim 11, further comprising fabricating on the chip grounded via walls spaced apart from the traces at spacings selected to tune the common and differential mode impedances.

13. The method of claim 11, wherein the coiled coupled-line hybrid coupler on a chip is fabricated with microstrip transmission lines made of a superconducting metal.

14. The method of claim 11, wherein the number of cells is selected to be greater than 10.

15. The method of claim 14, wherein each coil in each cell is between ten and twenty micrometers in diameter.

16. A reciprocal quantum logic (RQL) circuit comprising:
a coupler comprising a coiled coupled-line hybrid coupler cell, the cell comprising:
a superconducting primary transmission line comprising planar spiral-shaped input and output primary traces on a first plane and, on a second plane above or below the first plane, a planar carry-over primary trace shaped as two connected spirals, the spirals of the carry-over primary trace being wound in opposite directions and displaced from each other in two planar dimensions, traces of the primary transmission line being galvanically connected in series with the primary carry-over trace connecting the primary input and output traces;
a superconducting secondary transmission line comprising planar spiral-shaped input and output secondary traces on the first plane and, on the second plane, a planar carry-over secondary trace shaped as two connected spirals, the spirals of the carry-over secondary trace being wound in opposite directions and displaced from each other in two planar dimensions, the traces of the secondary transmission line being galvanically connected in series with the secondary carry-over trace connecting the secondary input and output traces; and
input and output ports for each of the primary and secondary transmission lines configured to connect to corresponding ports of identical hybrid coupler cells when arranged adjacently to the coupler cell in serial fashion;
wherein the traces form two coils that provide inductive and capacitive coupling between the primary and secondary transmission lines; and
an RQL clock network, wherein the coupler is configured to provide signals separated in phase by 90° to the RQL clock network by respectively connecting in-phase ("I") and quadrature-phase ("Q") resonators of the RQL clock network to different transmission lines of the coupler at opposite ends of the coupler.

17. The RQL circuit of claim 16, wherein adjacent parallel portions of the primary and secondary transmission lines are transversely spaced apart from each other by a coupling distance substantially uniformly over a coupling length that includes the two coils, the coupling distance being configured to provide an even-mode impedance of between about one hundred ohms and about one hundred forty ohms and an odd-mode impedance of between about fifteen ohms and about twenty-five ohms for the coupler cell.

18. The RQL circuit of claim 17, the coupling distance being configured to provide an even-mode impedance of about one hundred twenty ohms and an odd-mode impedance of between about one hundred ohms and about one hundred forty ohms for the coupler cell.

19. The RQL circuit of claim 16, wherein the coupler comprises a connected series array of at least ten instances of the cell.

20. The RQL circuit of claim 16, wherein the coupler has an octave bandwidth with an about ±0.5 dB power tolerance and an about ±1° phase tolerance over a predefined frequency band.

* * * * *